United States Patent
Shu et al.

(10) Patent No.: US 10,446,395 B1
(45) Date of Patent: Oct. 15, 2019

(54) SELF-ALIGNED MULTIPLE PATTERNING PROCESSES WITH LAYERED MANDRELS

(71) Applicant: GLOBALFOUNDRIES Inc., Grand Cayman (KY)

(72) Inventors: Jiehui Shu, Clifton Park, NY (US); Xiaohan Wang, Clifton Park, NY (US); Qiang Fang, Ballston Lake, NY (US); Zhiguo Sun, Halfmoon, NY (US); Jinping Liu, Ballston Lake, NY (US); Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/950,364

(22) Filed: Apr. 11, 2018

(51) Int. Cl.
*H01L 21/033* (2006.01)
*H01L 23/522* (2006.01)
*H01L 21/768* (2006.01)
*H01L 23/528* (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/76816* (2013.01); *H01L 21/76877* (2013.01); *H01L 23/528* (2013.01); *H01L 23/5226* (2013.01)

(58) Field of Classification Search
CPC .............. H01L 21/033–0338; H01L 21/76816
See application file for complete search history.

(56) References Cited

U.S. PATENT DOCUMENTS

| | | | |
|---|---|---|---|
| 8,669,180 B1 * | 3/2014 | Lee | H01L 21/76807 257/E21.088 |
| 9,177,797 B2 | 11/2015 | Chang et al. | |
| 9,711,447 B1 | 7/2017 | Shu et al. | |
| 9,818,613 B1 * | 11/2017 | Huang | H01L 21/0332 |
| 2007/0238053 A1 * | 10/2007 | Hashimoto | H01L 21/0337 430/313 |
| 2012/0295441 A1 * | 11/2012 | Hong | H01L 21/0337 438/683 |
| 2014/0252630 A1 | 9/2014 | Chang et al. | |
| 2014/0273442 A1 * | 9/2014 | Liu | H01L 21/76816 438/666 |
| 2015/0147882 A1 * | 5/2015 | Yao | H01L 21/76879 438/675 |
| 2015/0200096 A1 * | 7/2015 | Huang | H01L 21/0338 257/390 |
| 2015/0340233 A1 | 11/2015 | Huang et al. | |

* cited by examiner

*Primary Examiner* — Bryan R Junge
(74) *Attorney, Agent, or Firm* — Thompson Hine LLP; Anthony Canale

(57) ABSTRACT

Methods of self-aligned multiple patterning and structures formed by self-aligned multiple patterning. A mandrel line is patterned from a first mandrel layer disposed on a hardmask and a second mandrel layer disposed over the first mandrel layer. A first section of the second mandrel layer of the mandrel line is removed to expose a first section of the first mandrel layer. The first section of the first mandrel layer is masked, and the second sections of the second mandrel layer and the underlying second portions of the first mandrel layer are removed to expose first portions of the hardmask. The first portions of the hardmask are then removed with an etching process to form a trench in the hardmask. A second portion of the hardmask is masked by the first portion of the first mandrel layer during the etching process to form a cut in the trench.

17 Claims, 9 Drawing Sheets

US 10,446,395 B1

SELF-ALIGNED MULTIPLE PATTERNING PROCESSES WITH LAYERED MANDRELS

BACKGROUND

The present invention relates to semiconductor device fabrication and integrated circuits and, more specifically, to methods of self-aligned multiple patterning and structures formed by self-aligned multiple patterning.

A back-end-of-line (BEOL) interconnect structure may be used to connect device structures fabricated on a substrate during front-end-of-line (FEOL) processing with each other and with the environment external to the chip. Self-aligned patterning processes used to form a BEOL interconnect structure involve mandrel lines as sacrificial features that establish a feature pitch. Sidewall spacers are formed adjacent to the sidewalls of the mandrel lines. After selective removal of the mandrel lines, the spacers are used as an etch mask to etch an underlying hardmask over areas exposed by mandrel removal and areas between the spacers. The pattern is transferred from the hardmask to an interlayer dielectric layer to define trenches in which the wires of the BEOL interconnect structure are formed.

Cuts may be formed in mandrel lines in order to section the mandrel lines and define discontinuities between the sections that subsequently are used to form adjacent wires that are spaced apart at their tips with a tip-to-tip spacing. Non-mandrel cuts may also be formed in the hardmask itself along non-mandrel lines exposed between the sidewall spacers and filled by spacer material when the sidewall spacers are formed on the mandrel lines. A pattern reflecting the cut mandrel lines, the non-mandrel lines, and non-mandrel cuts is transferred to the hardmask and subsequently from the hardmask to form the trenches in the interlayer dielectric layer.

At larger pitch nodes, imperfections in the interconnect lines resulting from self-aligned patterning processes were relatively insignificant. However, as feature sizes have progressively shrunk to sub-10 nanometer pitches, various effects of these imperfections have become magnified, such as increased electrical resistance in interconnect lines and generating shorts between interconnect lines.

Improved methods of self-aligned multiple patterning and structures formed by self-aligned multiple patterning are thus needed.

SUMMARY

In an embodiment of the invention, a method includes forming a first mandrel line with a first mandrel layer disposed on a hardmask and a second mandrel layer disposed over the first mandrel layer. A first section of the second mandrel layer is removed to form a mandrel cut that exposes a first section of the first mandrel layer. The first section of the first mandrel layer is arranged along the first mandrel line between respective second sections of the second mandrel layer. After masking the first section of the first mandrel layer, the second sections of the second mandrel layer are removed with a first etching process to expose the second sections of the first mandrel layer. After removing the second sections of the second mandrel layer, the second sections of the first mandrel layer are removed to expose first portions of the hardmask. The first portions of the hardmask are then removed with a second etching process to form a trench. During the second etching process, a second portion of the hardmask is masked by the first section of the first mandrel layer to form a cut in the first trench in the hardmask.

In another embodiment of the invention, a structure includes a first metallization line that has a first section, a second section, a first outer sidewall and a second outer sidewall, and a cut disposed between the first section and the second section. The structure further includes a second metallization line adjacent to the first metallization line, and the second metallization line has a third outer sidewall adjacent to the first outer sidewall. The structure further includes a third metallization line adjacent to the first metallization line, and the third metallization line has a fourth outer sidewall adjacent to the second outer sidewall. A first distance between the third outer sidewall and the fourth outer sidewall that traverses the cut in the first metallization line is equal to a second distance between the third outer sidewall and the fourth outer sidewall that traverses the first section of the first metallization line.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 5A is a top view of the structure in which FIG. 5 is taken generally along line 5-5.

FIG. 7A is a top view of the structure in which FIG. 7 is taken generally along line 7-7.

FIG. 8A is a top view of the structure in which FIG. 8 is taken generally along line 8-8.

FIG. 9A is a top view of the structure in which FIG. 9 is taken generally along line 9-9.

FIG. 12A is a top view of the structure in which FIG. 12 is taken generally along line 12-12.

DETAILED DESCRIPTION

Figure 1:
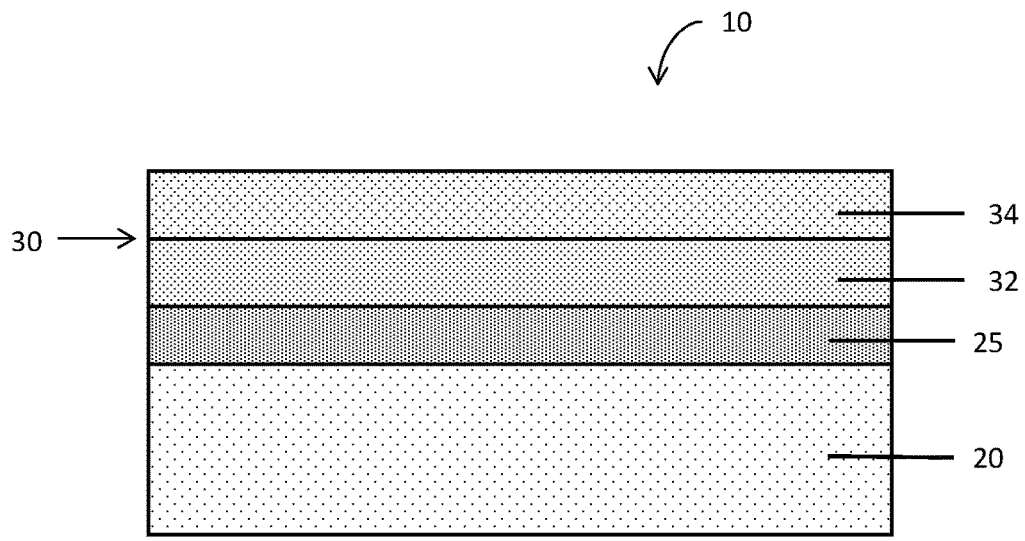
FIGS. 1-12 are cross-sectional views of a structure at successive fabrication stages of a processing method in accordance with embodiments of the invention.

With reference to FIG. 1 and in accordance with embodiments of the invention, a structure 10 includes an interlayer dielectric layer 20, a hardmask 25, and a multiple-layer mandrel stack 30. The interlayer dielectric layer 20 may be comprised of an electrically-insulating dielectric material, such as hydrogen-enriched silicon oxycarbide (SiCOH) or another type of low-k dielectric material. The interlayer dielectric layer 20 may be located on a substrate (not shown in FIG. 1) that includes device structures fabricated by front-end-of-line (FEOL) processing to form an integrated circuit. The hardmask 25 overlies the interlayer dielectric layer 20 and may be comprised of a metal-based material, such as titanium nitride, suitable for use as a hardmask.

The multiple-layer mandrel stack 30 includes a lower mandrel layer 32 comprised of a material and an upper mandrel layer 34 comprised of another material different from the material of the lower mandrel layer 32. The materials of the upper mandrel layer 34 and lower mandrel layer 32 are selected so that, as described below, the material of the upper mandrel layer 34 may be selectively removed in an etching process that etches little to no material of the lower mandrel layer 32. The lower mandrel layer 32 may be comprised of, for example, silicon dioxide, silicon oxynitride, silicon nitride, amorphous carbon, or a combination of these materials in a layered arrangement. The upper mandrel layer 34, in one example, may be comprised of amorphous silicon (α-Si) or another material that can be removed selective to the material of the lower mandrel layer 32. The material of the lower mandrel layer 32 should also exhibit high etch selectivity to the material of the hardmask 25.

The hardmask 25 may be a single hardmask comprised of a metal nitride, such as titanium nitride. In conventional fabrication processes, in addition to a metal nitride hardmask, a dielectric hardmask, such as a silicon nitride hardmask, is disposed over the metal nitride hardmask; mandrel lines and non-mandrel lines are then separately patterned in the dielectric hardmask and subsequently replicated in the metal oxide hardmask. The multiple-layer mandrel stack 30 eliminates the need for an additional dielectric hardmask, and allows for both mandrel lines and non-mandrel lines to be etched as trenches into the hardmask 25 in a single step, as described further below.

Figure 2:
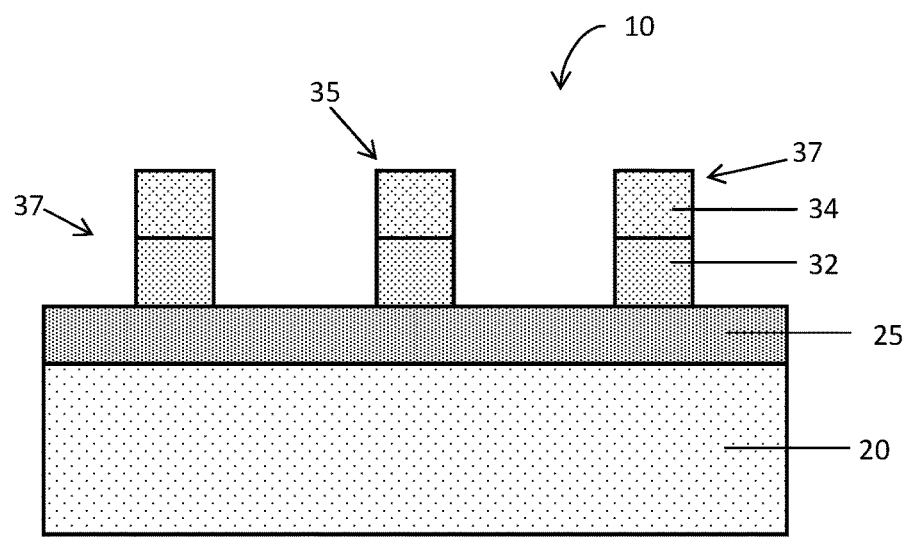

With reference to FIG. 2 in which like reference numerals refer to like features in FIG. 1 and at a subsequent fabrication stage of the processing method, the multiple-layer mandrel stack 30 is etched to form mandrel lines 35, 37. To that end, a patterning layer (not depicted in FIG. 2) may be provided over the multiple-layer mandrel stack 30 that masks portions of the bi-layer mandrel stack and leaves other portions of the multiple-layer mandrel stack 30 exposed, and the exposed portions of the bi-layer mandrel stack etched. The patterning layer may be comprised of a dielectric material, such as a low-temperature oxide (LTO) of silicon. Each of the mandrel lines 35, 37 includes a section of the upper mandrel layer 34 that is stacked over a section of the lower mandrel layer 32 in the representative bi-layer arrangement. The section of the lower mandrel layer 32 of each of the mandrel lines 35, 37 is in direct contact with the hardmask 25. The mandrel lines 35, 37, which are comprised of a stack containing multiple materials provided by the different layers, are used in a self-aligned multiple patterning process and, in particular, are used in a self-aligned double patterning process.

Figure 3:
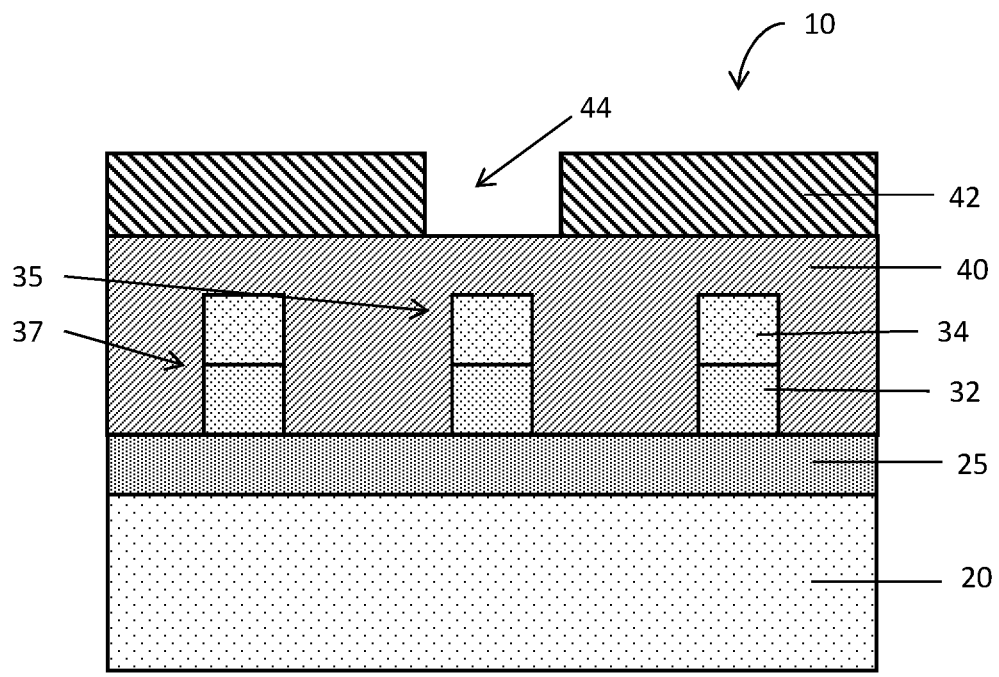

With reference to FIG. 3 in which like reference numerals refer to like features in FIG. 2 and at a subsequent fabrication stage of the processing method, a lithography stack 40 and patterned resist 42 are formed over structure 10. Lithography stack 40 may include one or more photolithography layers, such as an anti-reflective layer, a sacrificial hardmask layer, and a planarization layer. The patterned resist 42 is patterned with an opening 44 to expose a portion of the lithography stack 40, the exposed portion of the lithography stack corresponding to a cut to be formed in the upper mandrel layer 34 of mandrel line 35.

Figure 4:
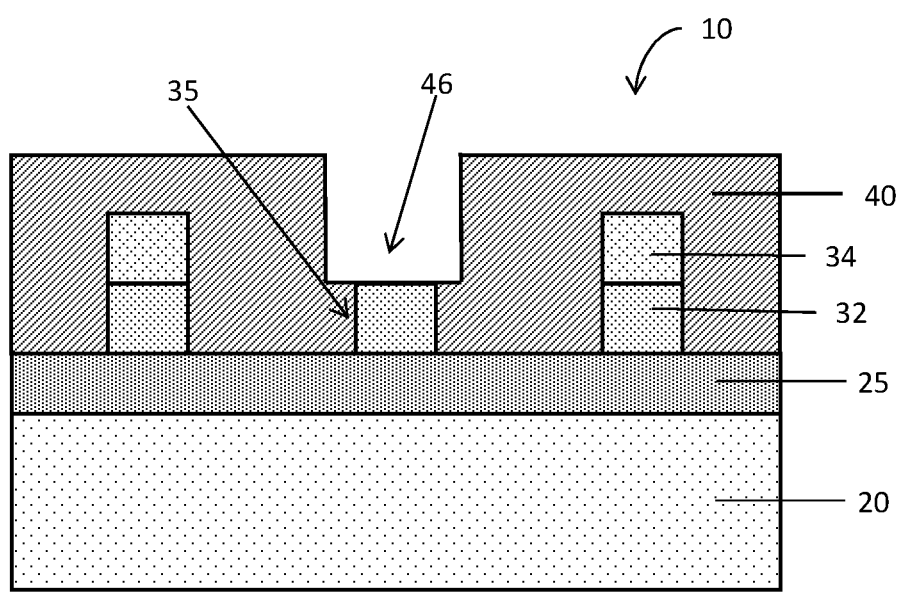

With reference to FIG. 4 in which like reference numerals refer to like features in FIG. 3 and at a subsequent fabrication stage of the processing method, the exposed portion of lithography stack 40 is etched to expose the underlying section of the upper mandrel layer 34 of the mandrel line 35 while remaining portions of the lithography stack mask the adjacent sections of the upper mandrel layer 34. Subsequently the exposed section of upper mandrel layer 34 is selectively removed by an etching process. The etching of upper mandrel layer 34 may include a selective anisotropic reactive ion etch (RIE) process, for example, to remove the material of the upper mandrel layer 34 selective to the material of the lower mandrel layer 32, which results in a mandrel cut 46 formed in the section of the upper mandrel layer 34 of mandrel line 35. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. For example, in embodiments in which the upper mandrel layer 34 is comprised of amorphous silicon and the lower mandrel layer 32 is comprised of silicon oxynitride, a selective anisotropic RIE process may be controlled to remove amorphous silicon at a greater etch rate than silicon oxynitride.

Figure 5:
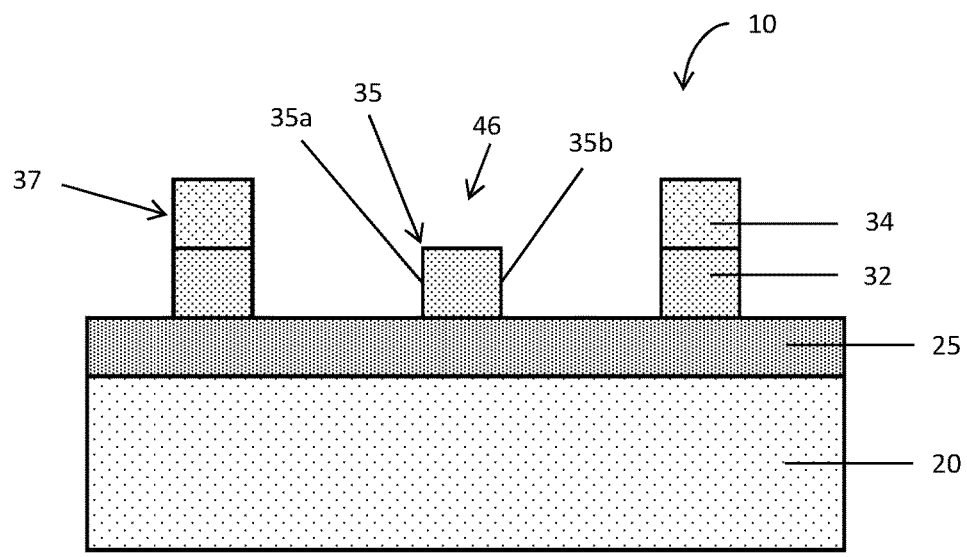
Figure 5A:
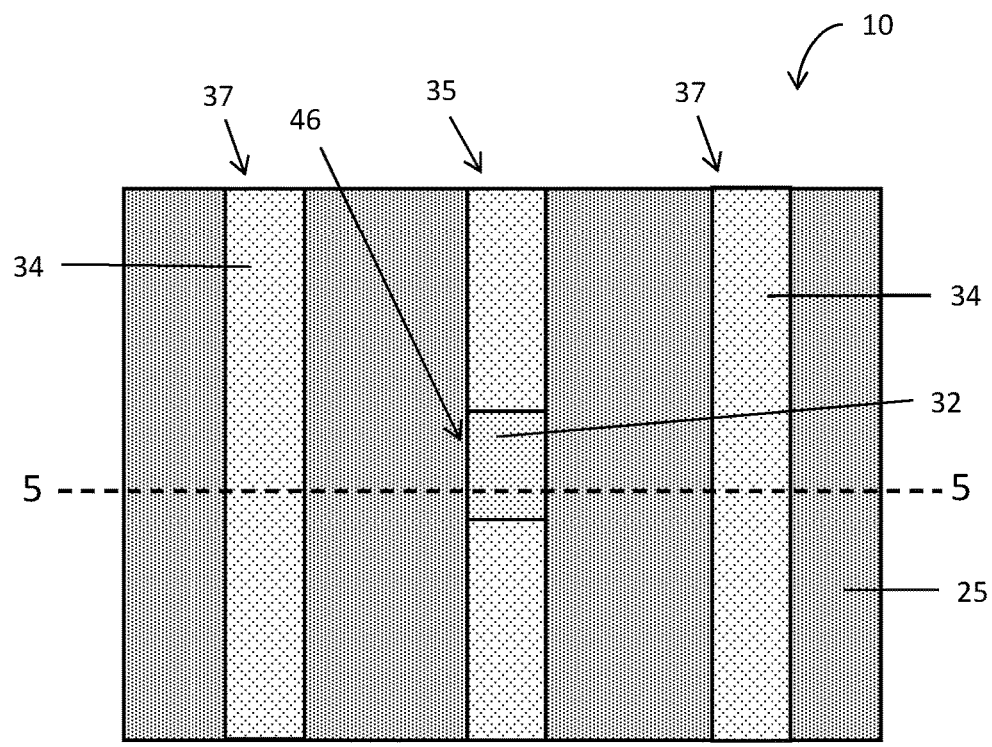

With reference to FIGS. 5 and 5A in which like reference numerals refer to like features in FIG. 4 and at a subsequent fabrication stage of the processing method, remaining portions of lithography stack 40 are removed from structure 10, which exposes mandrel lines 35, 37. As best shown in FIG. 5A, the mandrel cut 46 in the upper mandrel layer 34 of mandrel line 35 is disposed between adjacent sections of upper mandrel layer 34 of mandrel line 35, while lower mandrel layer 32 of mandrel line 35 is uncut and remains in place over a strip of the hardmask 25. The section of the lower mandrel layer 32 remaining in the mandrel cut 46 maintains the continuity of the sidewalls 35a, 35b of the mandrel line 35.

Figure 6:
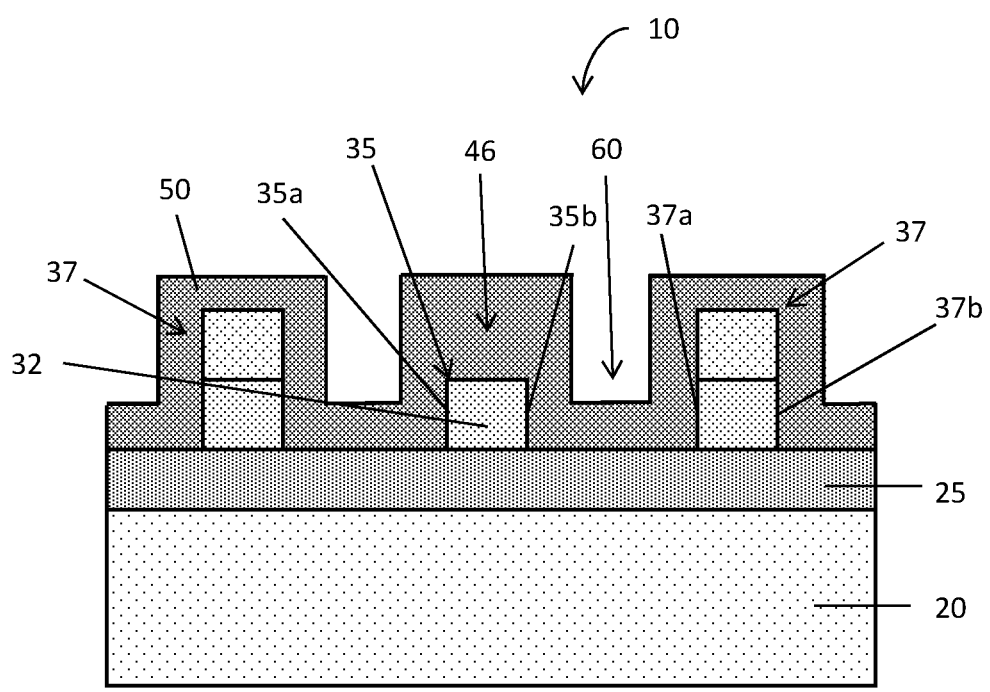

With reference to FIG. 6 in which like reference numerals refer to like features in FIGS. 5 and 5A and at a subsequent fabrication stage of the processing method, a conformal layer 50 is deposited over mandrel lines 35, 37 and over hardmask 25 at gaps between mandrel lines 35, 37. The conformal layer 50 may be deposited by, for example, chemical vapor deposition (CVD) or atomic layer deposition (ALD), and may be comprised of an oxide of titanium, such as titanium dioxide ($TiO_2$), if the hardmask 25 is comprised of titanium nitride. The conformal layer 50 may conform to sidewalls 35a, 35b of mandrel line 35 and the sidewalls 37a, 37b of mandrel lines 37. In particular, portions of the conformal layer 50 conforms to sidewalls 35a, 35b of the lower mandrel layer 32 at mandrel cut 46 in the upper mandrel layer 34 of mandrel line 35, and other portions of conformal layer 50 merges inside the mandrel cut 46 to fill between the adjacent uncut sections of the upper mandrel layer 34 of mandrel line 35 and mask the underlying portion of lower mandrel layer 32. Gaps between the conformal layer 50 on sidewalls of adjacent mandrel lines, such as sidewall 35b of mandrel line 35 and sidewall 37a of mandrel line 37, define non-mandrel lines 60 disposed between adjacent pairs of mandrel lines 35, 37.

In conventional fabrication processes, mandrel line cuts are generally defined by initially forming cuts in a mandrel patterning layer prior to forming mandrel lines from a single mandrel layer, such as single layer of amorphous silicon. However, forming mandrel line cuts in this manner may be undesirable for several reasons. For example, the spacers follow the contour of the mandrel line ends and merge within the cuts, which produces gaps or indentations between the converging spacers at the edges of the cuts. This leads to a "necking" distortion effect in the non-mandrel lines at these gaps because the contours of the spacers are not planar. At later stages when the non-mandrel lines are etched into masking layers, the non-mandrel lines are distorted and wider than designed at these gaps. The resulting metallization lines are thus also wider at these gaps and may be insufficiently separated from adjacent metallization lines, potentially leading to shorts in the circuit structure. In circuit structures where some metallization lines may be less than 10 nm in width, such as metallization lines having widths less than or equal to 7 nm, the "necking" effect may also significantly increase electrical resistance in metallization lines due to the increased width of metallization lines across the distortions.

In the processes described herein, cuts in a mandrel line 35 are not made through the entire mandrel line 35 so as to expose an underlying portion of the hardmask. Rather, the mandrel line 35 includes the upper mandrel layer 34 and the lower mandrel layer 32, and the mandrel cut is initially defined only in the upper mandrel layer 34. As a result, a section of the lower mandrel layer 32 remains intact and masks an underlying portion of hardmask 25 of equal area. As described above, when the conformal layer 50 is formed over mandrel lines 35 and 37, portions of the conformal layer 50 fill the mandrel cut 46 in the upper mandrel layer 34 of mandrel line 35 and other portions of the conformal layer 50 conform to the sidewalls of the first mandrel layer 32 at the mandrel cut 46. This prevents formation of indentations in the conformal layer 50 at the mandrel cut 46 and thus also prevents the formation of distortions in the non-mandrel lines 60 and trenches in hardmask 25 formed from the non-mandrel lines.

Figure 7:
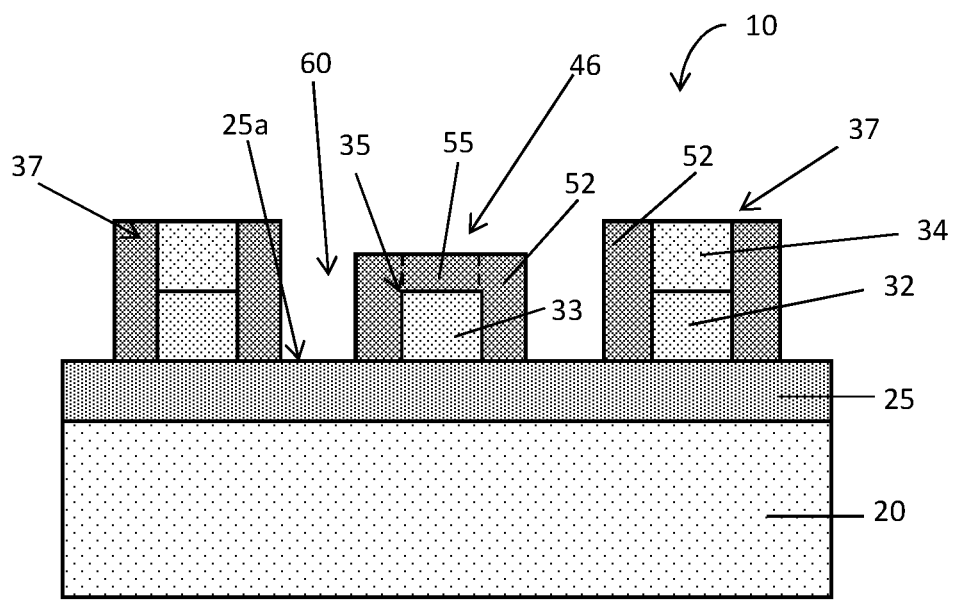
Figure 7A:
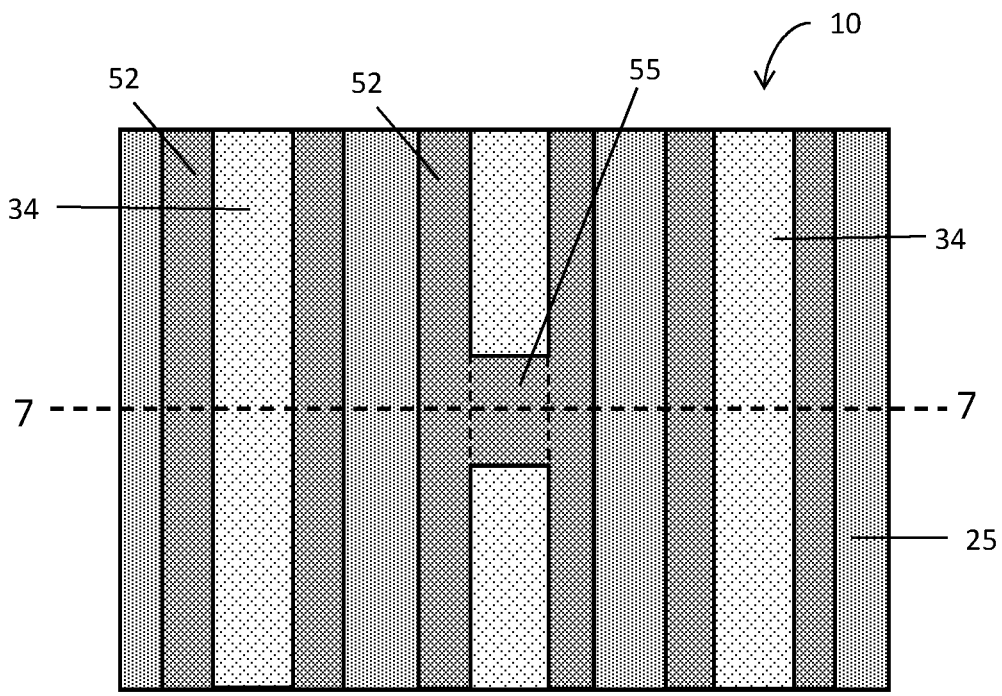

With reference to FIGS. 7 and 7A in which like reference numerals refer to like features in FIG. 6 and at a subsequent fabrication stage of the processing method, the conformal layer 50 is etched with a reactive ion etching process to reveal portions 25a of hardmask 25 corresponding to non-mandrel lines 60 and to form sidewall spacers 52 on sidewalls 35a, 35b, 37a, 37b of mandrel lines 35, 37. The etching process may remove the material of the conformal layer 50 selective to the materials of the hardmask 25 and the upper mandrel layer 34 in the mandrel lines 35, 37. The mandrel lines 35, 37 are revealed by the etching of the conformal layer 50. The etching process also reduces a thickness of the conformal layer 50 disposed in the mandrel cut 46. The partial removal of the conformal layer 50 in the mandrel cut 46 leaves a mandrel cut mask 55, which is comprised of the material of the conformal layer 50, masking an underlying portion 33 of the lower mandrel layer 32 of mandrel line 35.

Figure 8:
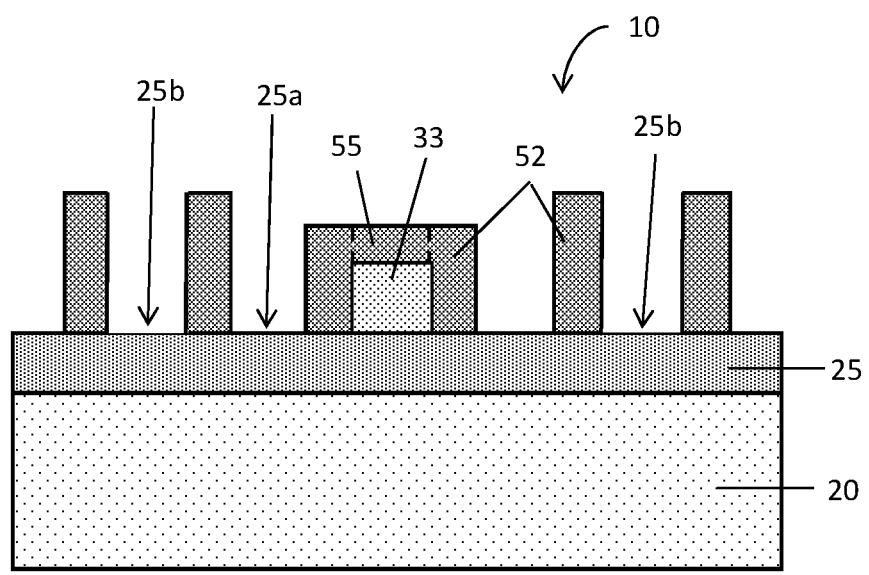
Figure 8A:
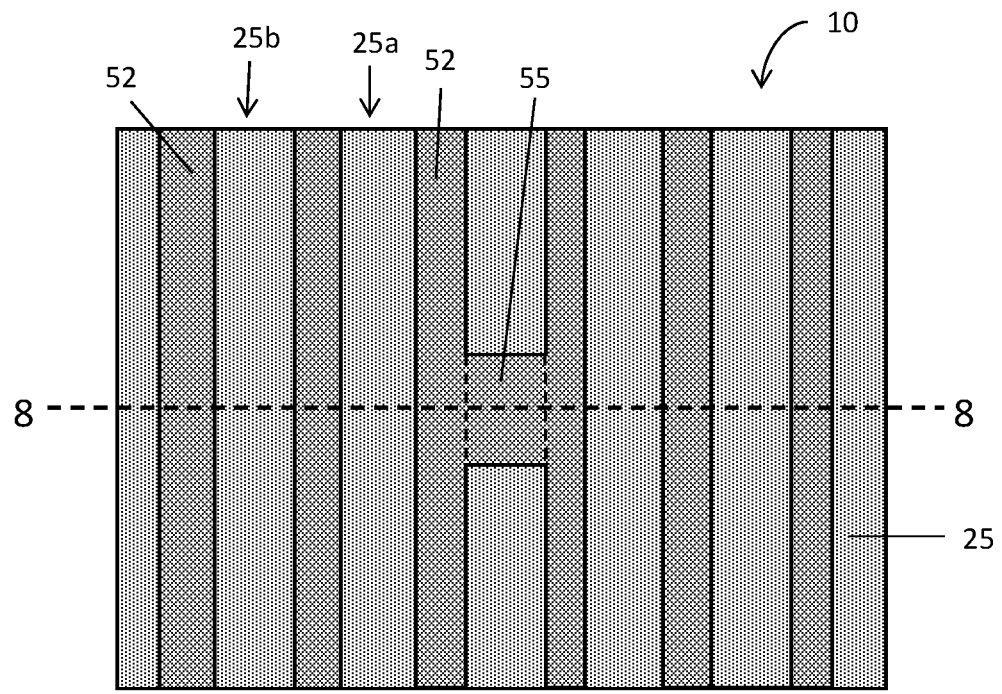

With reference to FIGS. 8 and 8A in which like reference numerals refer to like features in FIGS. 7 and 7A and at a subsequent fabrication stage of the processing method, exposed sections of mandrel lines 35, 37 are removed or "pulled" through one or more etching processes, which exposes underlying strips or portions 25b of hardmask 25. The one or more etching processes may, in one embodiment, include a single uninterrupted etching process that removes both sections of the upper mandrel layer 34 and lower mandrel layer 32 in the mandrel lines 35, 37 selective to the sidewall spacers 52 and hardmask 25. In another embodiment, the one or more etching processes may include one selective etching process to first selectively remove the material of exposed sections of upper mandrel layer 34 selective to the lower mandrel layer 32 and sidewall spacers 52 and hardmask 25, and another selective etching process to selectively remove the material of exposed sections of lower mandrel layer 32 selective to the sidewall spacers 52 and hardmask 25. Mandrel cut mask 55 masks the underlying portion 33 of mandrel line 35 during the etching process.

Figure 9:
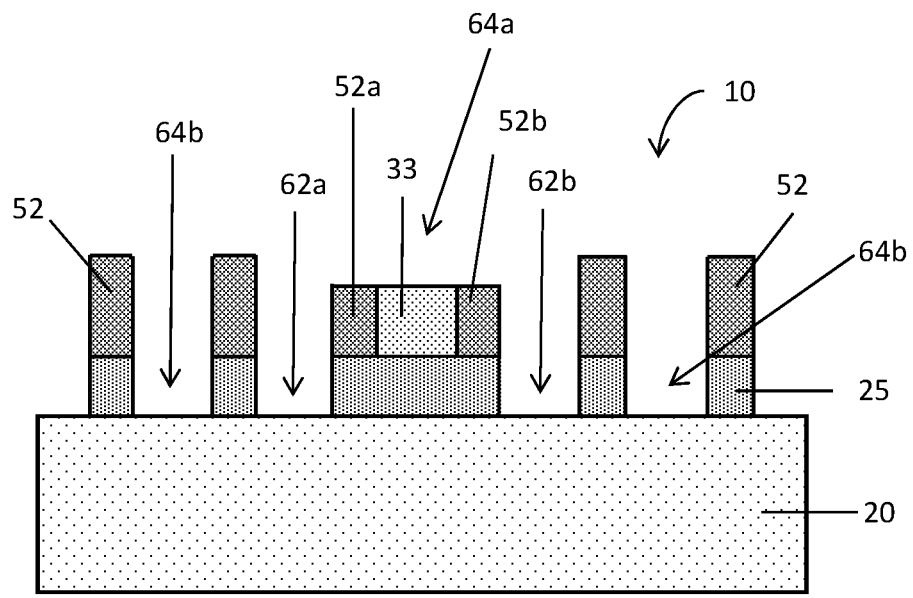
Figure 9A:
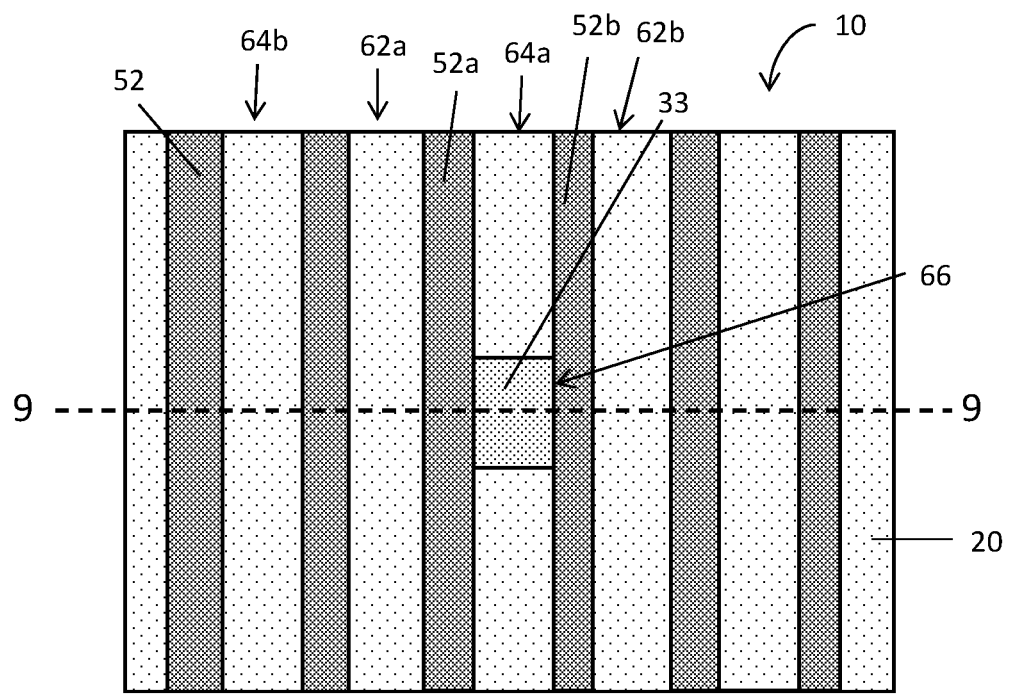

With reference to FIGS. 9 and 9A in which like reference numerals refer to like features in FIGS. 8 and 8A and at a subsequent fabrication stage of the processing method, exposed portions 25a, 25b of hardmask 25 are etched to respectively form non-mandrel trenches 62a, 62b and mandrel trenches 64a, 64b in the hardmask 25, which exposes underlying portions of the interlayer dielectric layer 20. Non-mandrel trenches 62a and 62b, which replicate the pattern of non-mandrel lines 60, and mandrel trenches 64a and 64b, which replicate the pattern of pulled mandrel lines 35, 37 and unpulled portion 33 of lower mandrel layer 32 of mandrel line 35, may be etched in the hardmask 25, for example, by an anisotropic RIE process that removes the hardmask 25 selective to the interlayer dielectric layer 20. The unpulled portion 33 of lower mandrel layer 32 and the mandrel cut mask 55 function during the etching process to transfer the mandrel cut in the mandrel line 35 to an underlying masked portion 66 of the hardmask 25, as shown in FIG. 9A. Spacer 52a, which conform to one sidewall of the unpulled portion 33 of the lower mandrel layer 32, defines a planar sidewall of the adjacent non-mandrel trench 62a, that is, a sidewall without "necking" indentations or distortions, as described above. Similarly, spacer 52b conforms to another sidewall of the unpulled portion 33 of the lower mandrel layer 32 to define a planar sidewall of the adjacent non-mandrel trench 62b. The mandrel cut mask 55 may be removed by the etching process forming the non-mandrel trenches 62a, 62b, and the mandrel trenches 64a, 64b.

Figure 10:
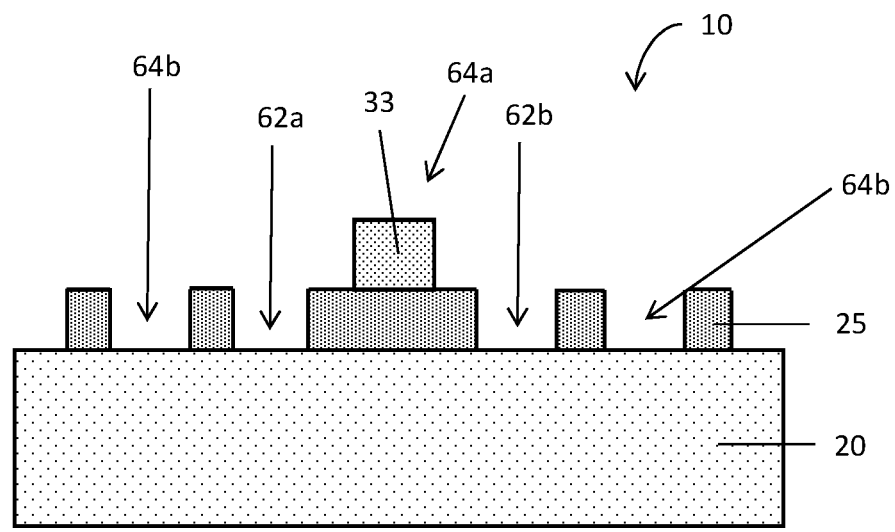

With reference to FIG. 10 in which like reference numerals refer to like features in FIGS. 9 and 9A and at a subsequent fabrication stage of the processing method, sidewall spacers 52, 52a, 52b are removed from over hardmask 25. The spacers may be removed, for example, by an etching process that selectively removes the material of sidewall spacers 52, 52a, 52b selective to the hardmask 25 and interlayer dielectric layer 20.

Figure 11:
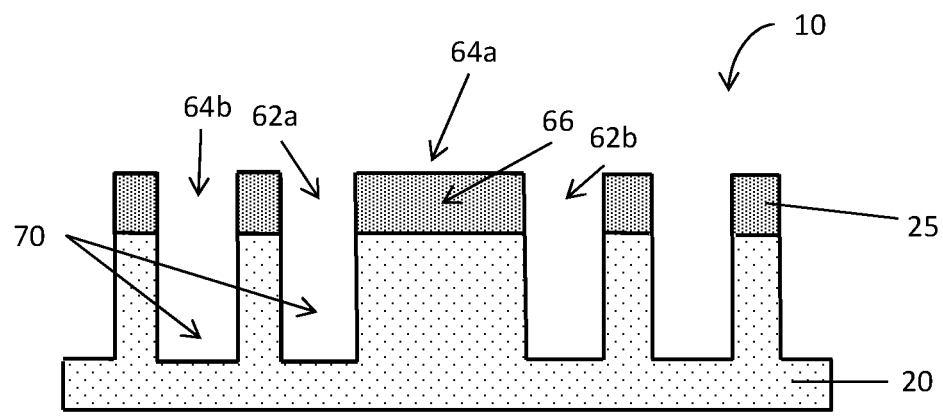

With reference to FIG. 11 in which like reference numerals refer to like features in FIG. 10 and at a subsequent fabrication stage of the processing method, portions of interlayer dielectric layer 20 exposed by mandrel trenches 64a, 64b and non-mandrel trenches 62a, 62b are etched to form metallization trenches 70 in the interlayer dielectric layer 20 that replicate the pattern of pulled mandrel lines 35, 37, non-mandrel trenches 62a and 62b, and masked portion 66 of the hardmask 25. The exposed portions of interlayer dielectric layer 20 may be etched, for example, by an anisotropic RIE.

Figure 12:
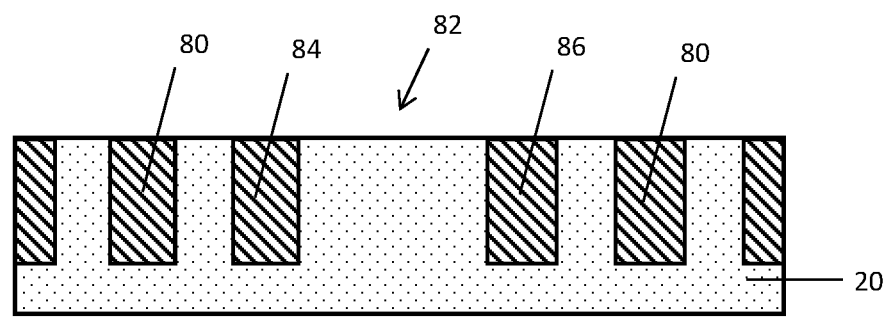
Figure 12A:
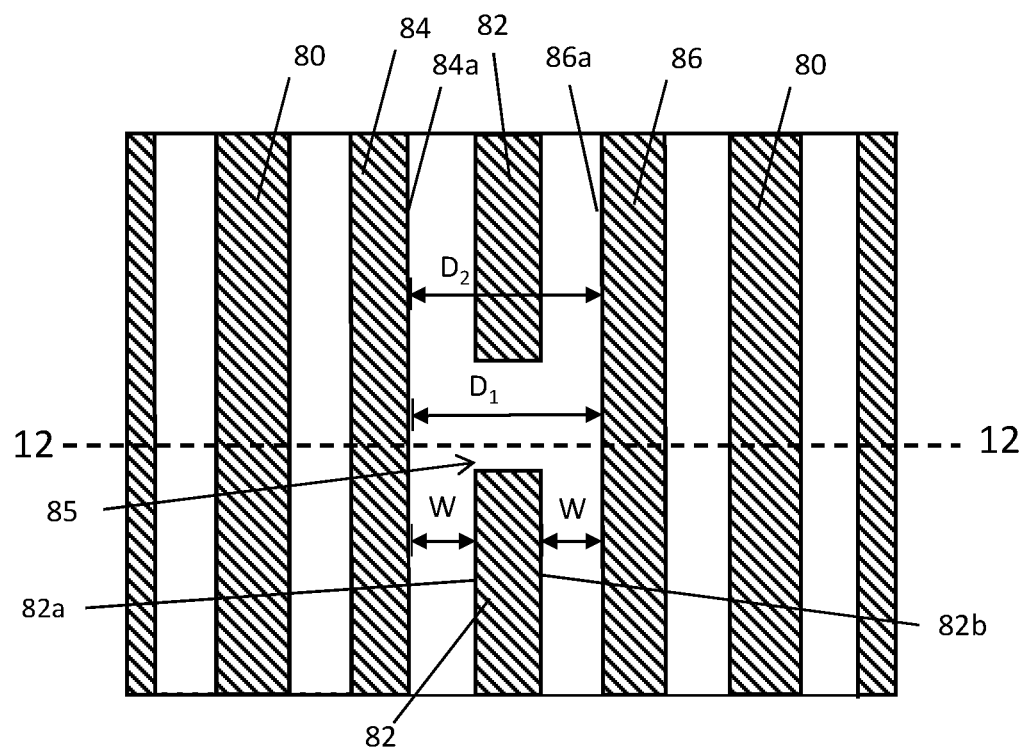

With reference to FIGS. 12 and 12A in which like reference numerals refer to like features in FIG. 11 and at a subsequent fabrication stage of the processing method, metallization trenches 70 are filled with a metal, such as copper or cobalt, to form metallization lines 80, 82, 84, 86 in interlayer dielectric layer 20. Metallization lines 80, 82, 84, 86 may have a width of less than or equal to 7 nm. Metallization line 82 includes a mandrel cut 85, which is filled with the material of the interlayer dielectric layer 20 and arranged along the length of the metallization line 82 in a row between portions of the metallization line 82. The mandrel cut 85 is transferred from the masked portion 66 of the hardmask 25 to the metallization line 82 when the interlayer dielectric layer 20 is patterned using the patterned hardmask 25.

Metallization line 84 may have an outer sidewall 84a that is adjacent to one outer sidewall 82a of metallization line 82, and metallization line 86 may have an outer sidewall 86a adjacent to another outer sidewall 82b of metallization line 82. A distance $D_1$ between the outer sidewall 84a of metallization line 84 and outer sidewall 86a of metallization line 86 that traverses the mandrel cut 85 in metallization line 82 may be equal to a distance $D_2$ between outer sidewall 84a and outer sidewall 86a that traverses a section of metallization line 82. That is, a width W of a portion of the interlayer dielectric layer 20 disposed between metalliline 82 and metallization line 84 may be uniform along a length of metallization lines 82, 84, as metallization line 84 may be formed without large distortions protruding toward or into the mandrel cut 85. Similarly, a width W of a portion of the interlayer dielectric layer 20 disposed between metallization line 82 and metallization line 86 may be uniform along a length of metallization lines 82, 86.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the "horizontal", as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a first mandrel line including a first mandrel layer disposed on a hardmask and a second mandrel layer disposed over the first mandrel layer;
   removing a first section of the second mandrel layer to form a mandrel cut that exposes a first section of the first mandrel layer and that is arranged along the first mandrel line between respective second sections of the second mandrel layer;
   masking the first section of the first mandrel layer;
   after masking the first section of the first mandrel layer, removing the second sections of the second mandrel layer with a first etching process to expose the second sections of the first mandrel layer;
   after removing the second sections of the second mandrel layer, removing the second sections of the first mandrel layer to expose first portions of the hardmask; and
   removing the first portions of the hardmask with a second etching process to form a first trench,
   wherein a second portion of the hardmask is masked by the first section of the first mandrel layer during the second etching process to form a cut in the first trench in the hardmask.

2. The method of claim 1 wherein the first mandrel layer is comprised of a first material, and the second mandrel layer is comprised of a second material that etches selective to the first material.

3. The method of claim 2 wherein removing the first section of the second mandrel layer comprises:
   masking the second sections of the second mandrel layer; and
   etching the first section of the second mandrel layer selective to the first section of the first mandrel layer.

4. The method of claim 2 wherein the first material is silicon dioxide, silicon oxynitride, silicon nitride, amorphous carbon, or a combination thereof.

5. The method of claim 4 wherein the second material is amorphous silicon.

6. The method of claim 2 wherein the second material is amorphous silicon.

7. The method of claim 1 wherein masking the first section of the first mandrel layer comprises:
   depositing a conformal layer on the first mandrel line,
   wherein a portion of the conformal layer fills the mandrel cut above the first section of the second mandrel layer.

8. The method of claim 7 wherein the conformal layer is comprised of an oxide of titanium.

9. The method of claim 7 further comprising:
   before removing the second sections of the second mandrel layer, etching the conformal layer to form a first spacer on a first sidewall of the first mandrel layer and a second spacer on a second sidewall of the first mandrel layer,
   wherein the first spacer and the second spacer extend across the mandrel cut on the first section of the first mandrel layer, and the portion of the conformal layer is removed when the conformal layer is etched to expose the first section of the first mandrel layer.

10. The method of claim 9 wherein the conformal layer is comprised of an oxide of titanium, and the hardmask is comprised of titanium nitride.

11. The method of claim 9 wherein the hardmask is arranged over an interlayer dielectric layer, and further comprising:
   forming a second trench in the hardmask adjacent to the first spacer and a third trench in the hardmask adjacent to the second spacer with the second etching process; and
   etching portions of the interlayer dielectric layer exposed by the first trench, the second trench, and the third trench in the hardmask to respectively form a first metallization trench, a second metallization trench, and a third metallization trench in the interlayer dielectric layer,
   wherein the cut in the first trench in the hardmask is transferred to the first metallization trench, the first spacer defines a planar sidewall of the second metallization trench at the cut, and the second spacer defines a planar sidewall of the third metallization trench at the cut.

12. The method of claim 7 wherein the second sections of the second mandrel layer are removed selective to the second sections of the first mandrel layer by the first etching process.

13. The method of claim 12 wherein the second sections of the first mandrel layer are removed selective to the hardmask by a third etching process.

14. The method of claim 13 wherein the portion of the conformal layer masks the first section of the first mandrel layer during the first etching process and during the third etching process.

15. The method of claim 7 wherein the second sections of the first mandrel layer are removed by the first etching process.

16. The method of claim 15 wherein the portion of the conformal layer masks the first section of the first mandrel layer during the first etching process.

17. The method of claim 1 wherein the hardmask is comprised of a metal nitride, and the first mandrel layer of the first mandrel line is in direct contact with the hardmask.

* * * * *